(12) United States Patent
Ataka et al.

(10) Patent No.: US 8,729,918 B2
(45) Date of Patent: May 20, 2014

(54) TEST APPARATUS, CIRCUIT MODULE AND MANUFACTURING METHOD

(75) Inventors: Tsuyoshi Ataka, Gunma (JP); Atsushi Ono, Saitama (JP)

(73) Assignee: Advantest Corporation, Tokyo (JP)

( * ) Notice: Subject to any disclaimer, the term of this patent is extended or adjusted under 35 U.S.C. 154(b) by 498 days.

(21) Appl. No.: 13/082,389

(22) Filed: Apr. 7, 2011

(65) Prior Publication Data

US 2012/0133385 A1 May 31, 2012

Related U.S. Application Data

(63) Continuation of application No. PCT/JP2009/005395, filed on Oct. 15, 2009.

(30) Foreign Application Priority Data

Oct. 28, 2008 (JP) ................................ 2008-276900

(51) Int. Cl.
*G01R 31/02* (2006.01)
*G01R 31/26* (2014.01)

(52) U.S. Cl.
USPC ............ 324/756.05; 324/750.08; 324/756.01; 439/197

(58) Field of Classification Search
CPC .......................................... G01R 31/02–31/26
USPC ............................................ 324/537–756.05
See application file for complete search history.

(56) References Cited

U.S. PATENT DOCUMENTS

| 6,304,448 | B1 | 10/2001 | Fukada et al. |
| 6,468,098 | B1 * | 10/2002 | Eldridge ........................ 439/197 |
| 7,863,915 | B2 * | 1/2011 | Miller ....................... 324/754.07 |

FOREIGN PATENT DOCUMENTS

| JP | 2001-250910 A | 9/2001 |
| JP | 2002-43488 A | 2/2002 |
| JP | 2002-280507 A | 9/2002 |

OTHER PUBLICATIONS

Office Action issued by the State Intellectual Property Office of the P.R. China, date of mailing of Dec. 14, 2012.
KIPO Office action for application No. 10-2011-7005427, dated May 25, 2012.
International Search Report (ISR) for International Application No. PCT/JP2009/005395 mailed on Jan. 12, 2010.
Translation of the International Preliminary Report on Patentability for International Application No. PCT/JP2009/005395 mailed on Jun. 16, 2011.
Notice of Reasons for Refusal of Japanese Patent Application No. 2010-535638, issued by the Japanese Patent Office on Sep. 3, 2013.
Taiwan Patent Office action for application Reference No. (101) R.O.C. Pat 2 (4) 04341 No. 10121270310, dated Nov. 19, 2012.

* cited by examiner

*Primary Examiner* — Melissa Koval
*Assistant Examiner* — Emily Chan

(57) ABSTRACT

An apparatus comprising a test circuit that is provided on a test substrate and tests the device under test; a sealing section that covers a region of the test substrate on which the test circuit is formed, and seals the test circuit to form a sealed space that is filled with a cooling agent; and a through-connector that passes through the sealing section and electrically connects the test circuit to an element provided outside the sealing section, such that the connection is not through the test substrate.

8 Claims, 18 Drawing Sheets

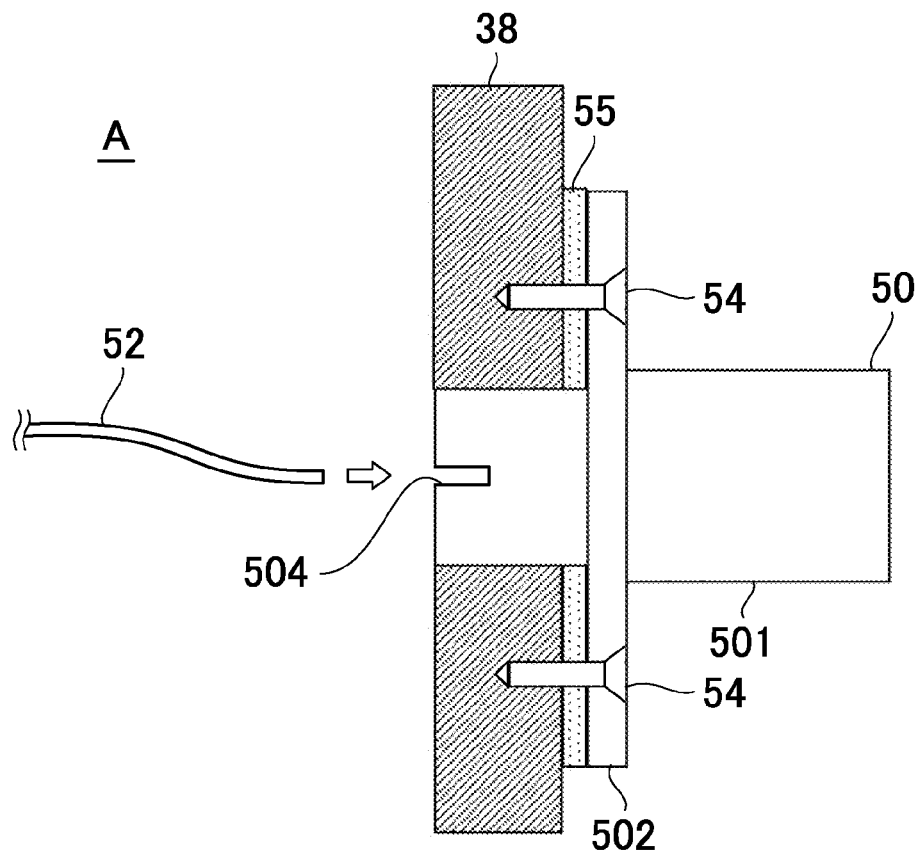
F I G . 4

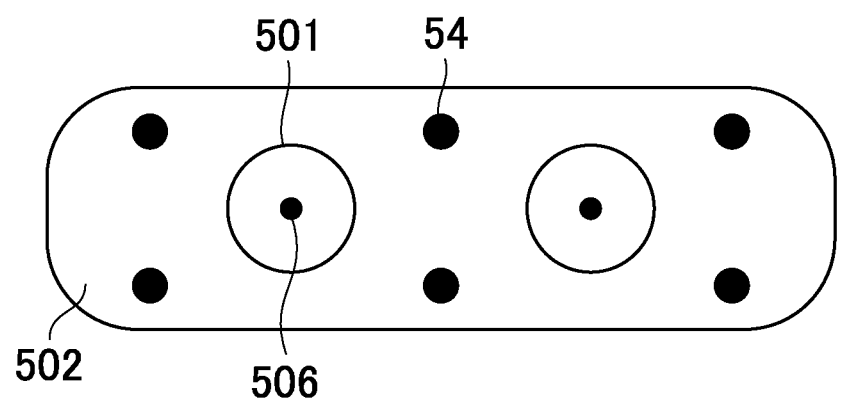
F I G . 5

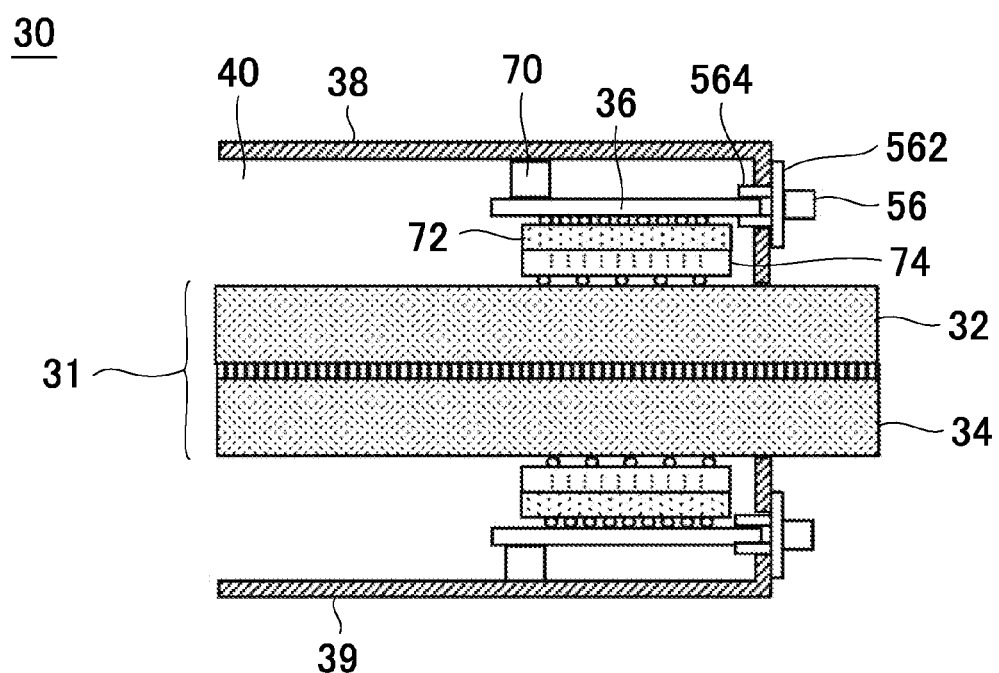
F I G . 7

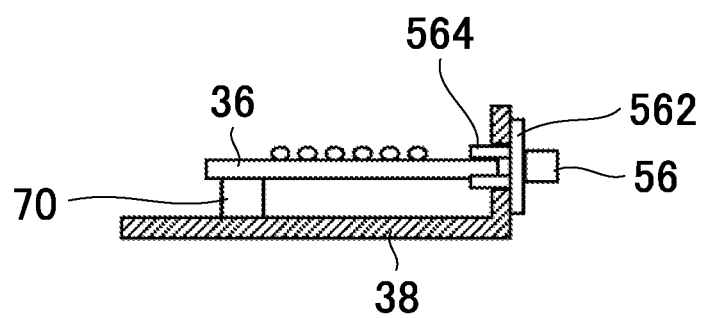
F I G . 9

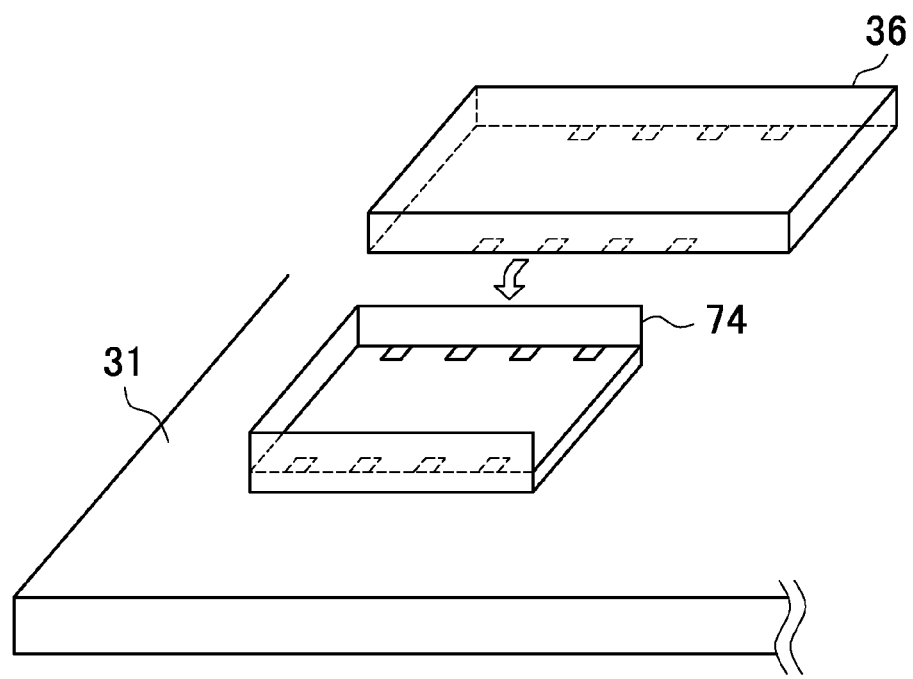
F I G . 13

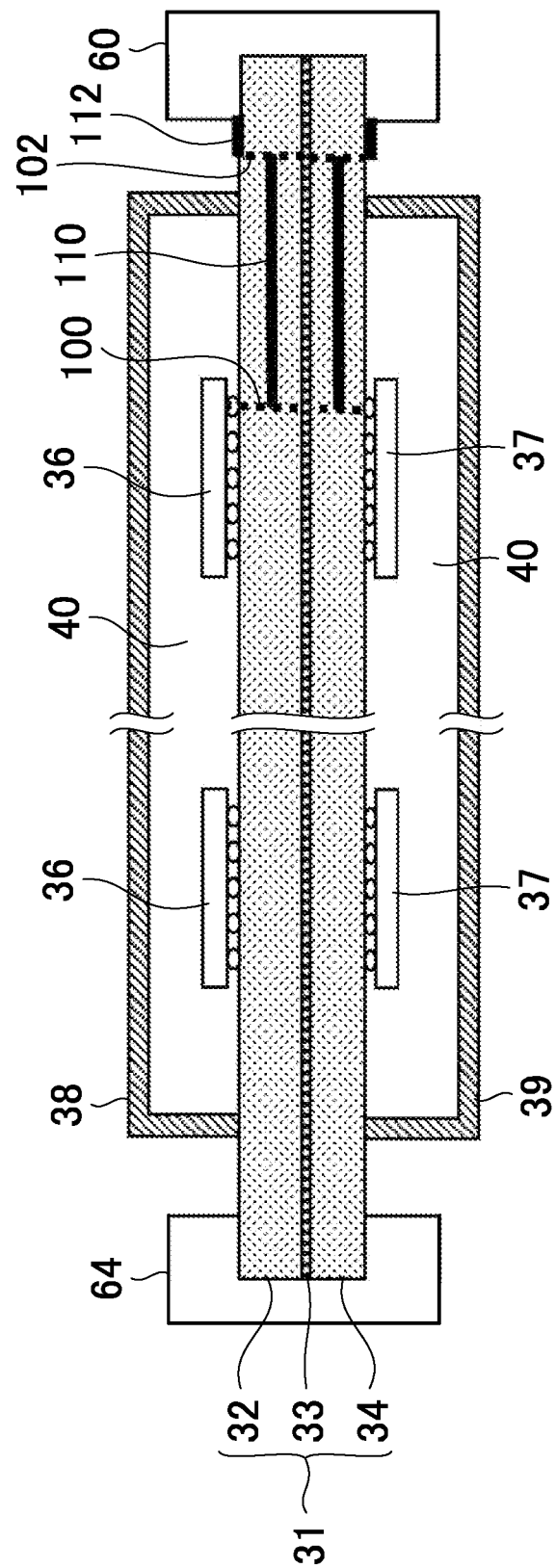

TEST APPARATUS, CIRCUIT MODULE AND MANUFACTURING METHOD

BACKGROUND

1. Technical Field

The present invention relates to a test apparatus, a circuit module, and a manufacturing method.

2. Related Art

A semiconductor device forming an electronic circuit generates heat when operating. In recent years, increased operating speed and further integration of circuits in semiconductor devices has led to an increase in the amount of heat generated by semiconductor devices. As a result, when a large number of semiconductor devices are mounted on a test substrate, it is necessary to cool the semiconductor devices. For example, in a semiconductor test apparatus, electrical circuit elements such as semiconductor devices mounted on a multi-layered test substrate can be cooled by covering the test substrate with a fluid case and passing a cooling agent through the fluid case, as described in Patent Document 1, for example.

Patent Document 1: Japanese Patent Application Publication No. 2002-280507

FIG. 18 shows a conventional method for cooling a test substrate on which electrical circuit elements, such as semiconductor devices, are mounted. As shown in FIG. 18, a multi-layer test substrate 31 is formed by layering a plurality of insulating boards 32 and 34 including epoxy resin and a pre-preg 33 including glass fiber base material, for example. The surfaces of the test substrate 31 include electrical circuit elements such as semiconductor devices and have a test circuit 36 and a test circuit 37 mounted respectively thereon. The test substrate 31 is connected to another test substrate via a connector 60 and a connector 64.

In order to lessen the temperature increased due to heat generated by the test circuit 36 and the test circuit 37, a sealing section 38 and a sealing section 39 functioning as a fluid case are attached to the test substrate 31. The test circuit 36 and the test circuit 37 are cooled by a cooling agent, such as a fluorine-based liquid, that fills the space between the test substrate 31 and the sealing section 38 and the space between the test substrate 31 and the sealing section 39.

The test circuit 36 and the connector 60 are electrically connected to each other by a first penetrating through-hole 100, substrate wiring 110, a second penetrating through-hole 102, and substrate wiring 112. When the substrate wiring in the insulating board 32 and the substrate wiring in the insulating board 34 are near each other, cross-talk can occur between the substrate wirings. Therefore, the substrate wiring 110 is formed within the insulating board 32.

However, when the substrate wiring 110 is formed in the insulating board 32, a stab is formed between the intersection of the penetrating through-hole 100 and the substrate wiring 110 and the intersection of the penetrating through-hole 100 and the pre-preg 33. When a stab is formed, the signal waveform is distorted by the reflection occurring at the end of the penetrating through-hole 100. Furthermore, the high-frequency component caused by the distortion is emitted to the outside of the test substrate 31 as noise.

When the frequency of the transmitted signal is 2 GHz or more, the problem described above is particularly pronounced. By using a surface via hole (SVH) and an internal via hole (IVH), cross-talk can be prevented and the occurrence of stab can be eliminated. However, using SVH and IVH increases the cost of the test substrate.

Furthermore, the test circuit 36 and the test circuit 37 desirably have many functions. As a result, it is expected that the number of pins of the test circuit 36 and the test circuit 37 will increase. When the number of pins increases, the problem described above becomes even more pronounced.

SUMMARY

Therefore, it is an object of an aspect of the innovations herein to provide a test apparatus, a circuit module, and a manufacturing method, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a test apparatus comprising a test circuit that is provided on a test substrate and tests the device under test; a sealing section that covers a region of the test substrate on which the test circuit is formed, and seals the test circuit to form a sealed space that is filled with a cooling agent; and a through-connector that passes through the sealing section and electrically connects the test circuit to an element provided outside the sealing section, such that the connection is not through the test substrate.

According to a second aspect related to the innovations herein, provided is a circuit module comprising an operation circuit that is provided on a circuit substrate and outputs an output signal corresponding to an input signal; a sealing section that covers a region of the circuit substrate on which the operation circuit is formed, and seals the operation circuit to form a sealed space that is filled with a cooling agent; and a through-connector that passes through the sealing section and electrically connects the operation circuit to an element provided outside the sealing section, such that the connection is not through the circuit substrate.

According to a third aspect related to the innovations herein, provided is a manufacturing method comprising providing, on a side surface of the sealing section, a through-connector having a protruding section that protrudes into a region sealed by the sealing section and into which the operation circuit is inserted; providing, on a surface of the circuit substrate sealed by the sealing section, a fixed section onto which is mounted the operation circuit inserted in the protruding section; after the operation circuit is inserted in the protruding section, mounting the operation circuit on the fixed section by fixing the sealing section to the circuit substrate; and filling the sealing section with the cooling agent.

The summary clause does not necessarily describe all necessary features of the embodiments of the present invention. The present invention may also be a sub-combination of the features described above.

BRIEF DESCRIPTION OF THE DRAWINGS

FIG. 4 is an enlarged view of section A where the sealing section 38 and the through-connector 50 are connected.

FIG. 5 is a cross-sectional view of the through-connector 50 as seen from the connector 60.

FIG. 7 is a cross-sectional view of a circuit module 30 according to a third embodiment, as seen from the side.

FIG. 9 shows a second step in a process for manufacturing the test module 30.

FIG. 13 is a perspective view of the fixed section 74 and the test circuit 36 according to the fifth embodiment.

FIG. 18 shows a conventional circuit module 30.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
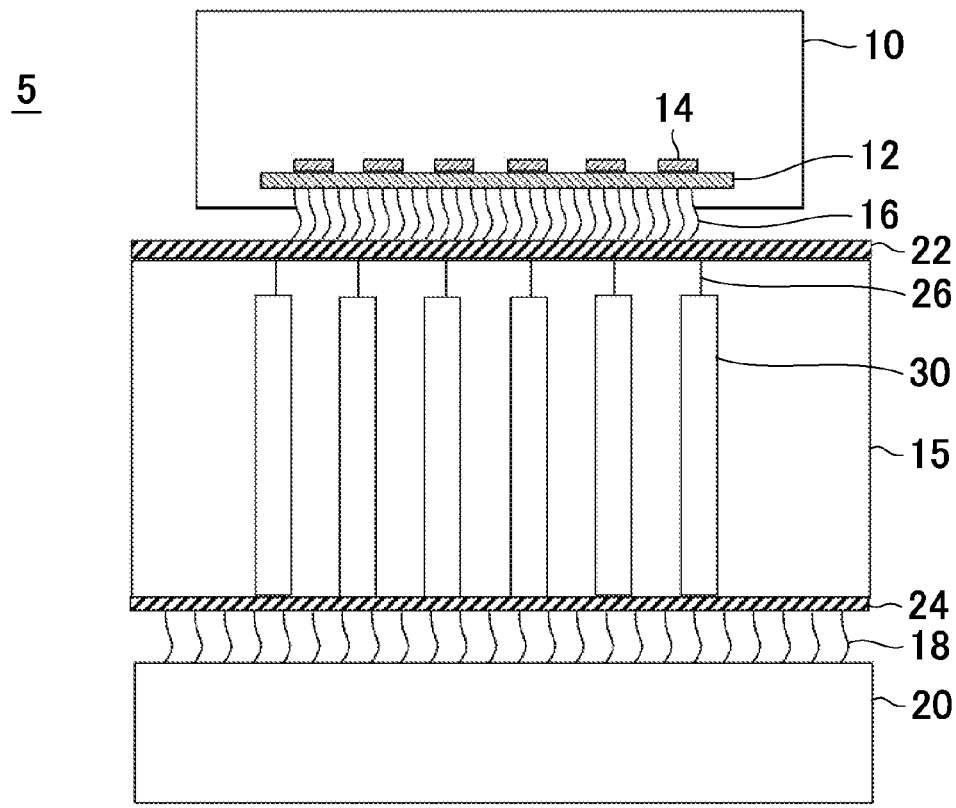
FIG. 1 shows an exemplary configuration of a semiconductor device test apparatus 5, which is an embodiment of a test apparatus.

FIG. 1 shows an exemplary configuration of a semiconductor device test apparatus 5, which is an embodiment of a test apparatus. The semiconductor device test apparatus 5 includes a handler 10, a test head 15, and a control section 20. The handler 10 includes a socket substrate 12 having sockets 14 on which devices under test are mounted. The socket substrate 12 is connected to a test head 15 via a first cable 16. The test head 15 is connected to the handler 10 via a performance board 22 and the first cable 16, and is connected to the control section 20 via a backboard 24 and a second cable 18.

The test head 15 may house a plurality of circuit modules 30. The control section 20 controls test circuits included in the test substrate via the second cable 18. In the example of FIG. 1, the test head 15 houses six circuit modules 30, but the number of circuit modules 30 may be increased according to the number of sockets 14 in the handler 10.

Figure 2:
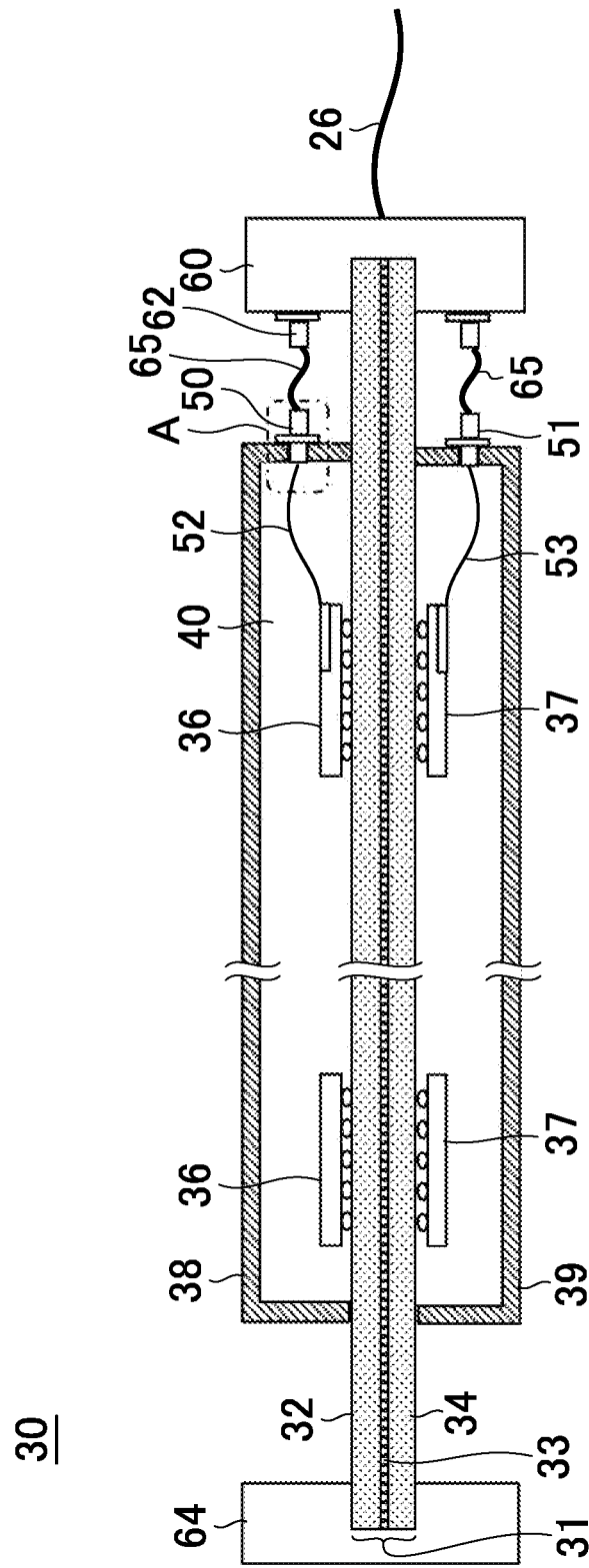
FIG. 2 is an exemplary cross-sectional view of a circuit module 30 as seen from the side.

FIG. 2 is an exemplary cross-sectional view of a circuit module 30 as seen from the side. The circuit module 30 includes a test substrate 31, a connector 60, a connector 64, a sealing section 38, and a sealing section 39. A plurality of insulating boards 32 and 34 including epoxy resin, for example, and a pre-preg 33 including a glass fiber base material, for example, are attached to the test substrate 31.

A test circuits 36 and a test circuit 37 are provided on respective sides of the test substrate 31. The test circuit 36 and test circuit 37 may be multi-chip modules (MCM) formed by mounting a plurality of silicon chips on the substrate. The test circuit 36 and the test circuit 37 may be low-temperature co-fired ceramic (LTCC) substrates obtained by forming copper or silver circuit patterns on a fired ceramic substrate, for example.

The first test circuit 36 and the second test circuit 37 input signals to the device under test and measure the response signals output by the device under test. The first test circuit 36 and the second test circuit 37 may each include a pattern generator, a formatter, a comparator, and a logic circuit, and may output an output signal corresponding to an input signal.

The sealing section 38 forms a sealed space 40 that seals the test circuit 36, by covering a region of the test substrate 31 on which the test circuit 36 is formed. The sealed space 40 is filled with a cooling agent. The test circuit 36 is cooled by the cooling agent filling the sealed space 40. A through-connector 50 is connected to a through-hole formed in the sealing section 38. The through-connector 50 may be connected to a terminal 62 formed in the connector 60, via a cable 65. The through-connector 50 may have a shape in compliance with SMP, BMA, or MMCX standards, for example.

The test circuit 36 and the through-connector 50 are connected by a cable 52. The cable 52 may be a flexible print circuit (FPC), and may include a high-frequency transmission line formed by a strip structure and a coplanar structure, for example. The test circuit 36 may be a multi-chip module having a substrate formed of an organic material, and the substrate may be formed integrally with the cable 52.

With the above structure, the through-connector 50 electrically connects the test circuit 36 to the connector 60 provided on the outside of the sealing section 38, without passing through the test substrate 31. In other words, the test circuit 36 is electrically connected to the performance board 22 via the cable 52, the through-connector 50, the cable 65, the terminal 62, the connector 60, and the cable 26. As a result, the output signal of the test circuit 36 can be transmitted to an external circuit without having the waveform thereof distorted by a stab within the test substrate 31.

A sealing section 39 may be provided on the surface of the insulating board 34, in the same manner as on the insulating board 32. The sealing section 39 may include a through-connector 51. The test circuit 37 may be connected to the through-connector 51 by the cable 53. In other words, the test circuit 36, the sealing section 38, and the through-connector 50 may be provided on one side of the test substrate 31 while the test circuit 37, the sealing section 39, and the through-connector 51 are provided on the other side.

Figure 3:
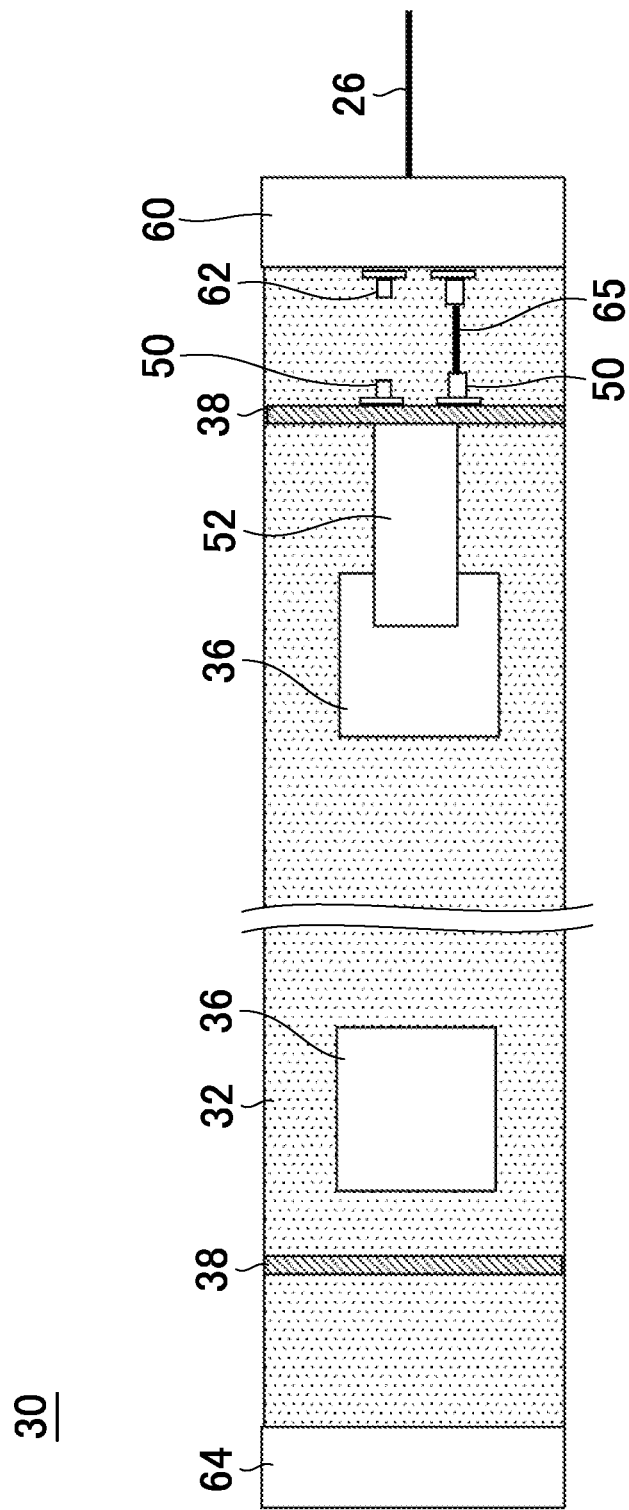
FIG. 3 is a cross-sectional view of a portion of the circuit module 30 as seen from above.

FIG. 3 is a cross-sectional view of a portion of the circuit module 30 as seen from above. As shown in FIG. 3, the sealing section 38 may include a plurality of through-connectors 50. The plurality of through-connectors 50 may be formed integrally. In the same way, the connector 60 may include a plurality of terminals 62, and a plurality of cables 65 may connect a plurality of terminals 62 to the plurality of through-connectors 50.

FIG. 4 is an enlarged view of section A where the sealing section 38 and the through-connector 50 are connected. The through-connector 50 includes a connecting section 501, a covering section 502, and a cable connecting section 504. The covering section 502 covers the through-holes of the sealing section 38 on the outer surface of the sealing section 38. The cable connecting section 504 includes a cable connection terminal, and electrically connects the cable 52 to the through-connector 50 when the cable 52 is inserted in the cable connecting section 504.

The occurrence of a gap between the sealing section 38 and the through-connector 50 may be prevented by inserting packing 55 between the sealing section 38 and the through-connector 50. Screws 54 may hold the sealing section 38, the packing 55, and the through-connector 50 together. After connecting the cable 52, the through-connector 50 may be connected to the sealing section 38.

FIG. 5 is a cross-sectional view of the through-connector 50 as seen from the connector 60. The through-connector 50 includes a signal terminal 506 in the center of a connecting section 501 as seen from the connector 60. The cable connecting section 504 and the signal terminal 506 are connected within the through-connector 50. The circuit module 30 may apply a reference potential to the outer surface of the connecting section 501 and apply a signal output by the test circuit 36 to the signal terminal 506.

Figure 6:
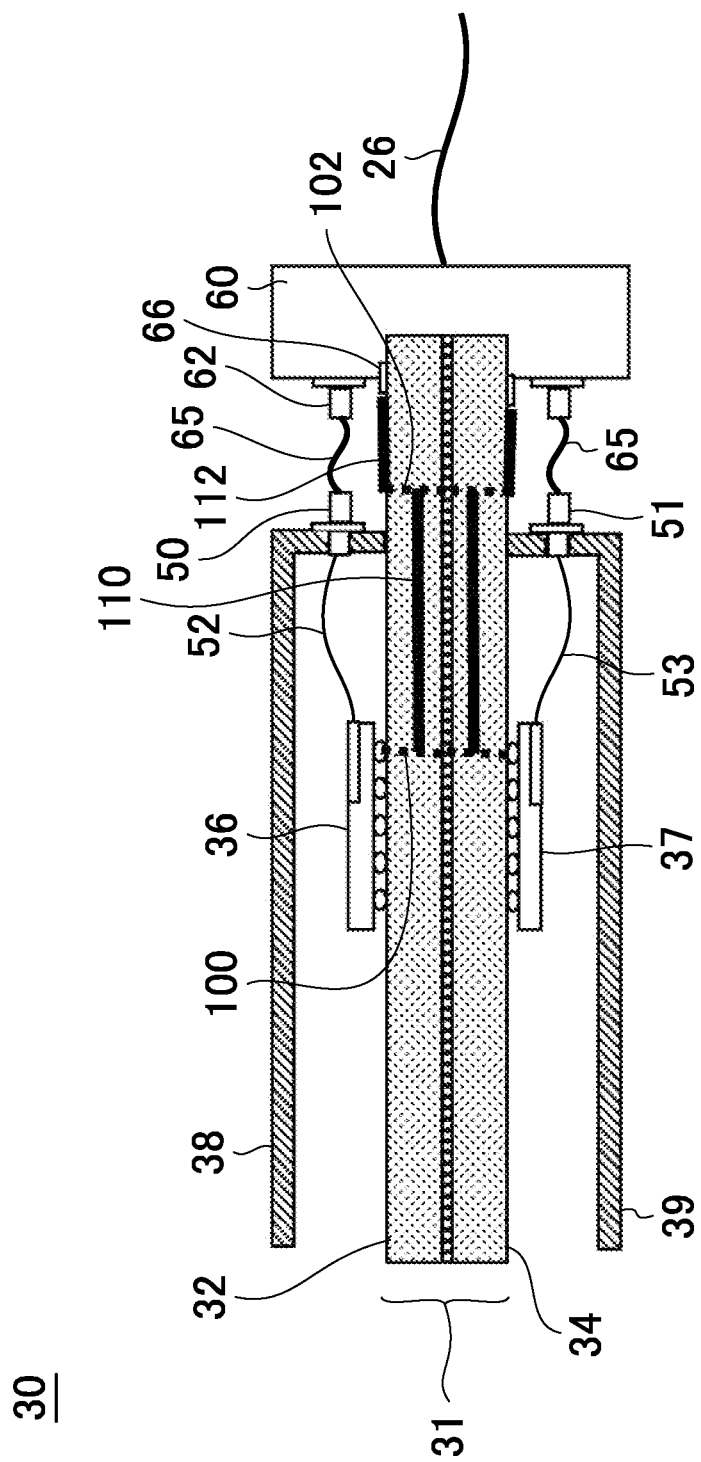
FIG. 6 is a cross-sectional view of a circuit module 30 according to a second embodiment, as seen from the side.

FIG. 6 is a cross-sectional view of a circuit module 30 according to a second embodiment, as seen from the side. In FIG. 6, the test substrate 31 includes substrate wiring 110 and substrate wiring 112. The substrate wiring 110 and the substrate wiring 112 electrically connect the test circuit 36 to a terminal on the outside of the sealing section.

The insulating board 32 includes a first penetrating through-hole 100 substantially underneath the terminal of the test circuit 36 and a second penetrating through-hole 102 in a region corresponding to a position outside the sealing section 38. The first penetrating through-hole 100 and the second penetrating through-hole 102 are connected by the substrate wiring 110. The second penetrating through-hole 102 and the connector terminal 66 are connected by the substrate wiring 112. The region corresponding to a position outside the sealing section 38 refers to the side of the sealing section 38 on which the connector 60 is disposed.

With the above structure, the test circuit 36 is electrically connected to an external element via the connector 60, by a plurality of paths. As a first path, the test circuit 36 is connected to the connector 60 through the cable 52, the through-connector 50, and the cable 65. As a second path, the test circuit 36 is connected to the connector 60 through the first penetrating through-hole 100, the substrate wiring 110, the second penetrating through-hole 102, the substrate wiring 112, and the connector terminal 66.

Here, the first penetrating through-hole 100 and the second penetrating through-hole 102 include a stab between the junction with the substrate wiring 110 and the junction with the pre-preg 33. When the test circuit 36 outputs a signal with high frequency, the effect of the reflected wave caused by the stab can cause distortion in the signal waveform. Therefore, the circuit module 30 may transmit each signal in a different path, based on the frequency of the signal output by the test circuit 36. For example, the first path may transmit signals with higher frequencies than the second path. In other words, the through-connector 50 may transmit signals with higher frequency than the substrate wiring.

If the cost for forming the first path is greater than the cost for forming the second path, transmitting all of the signals on the first transmission path increases the cost of the circuit module 30. Accordingly, the forming a plurality of signal transmission path in the circuit module 30 and selecting the path according to the frequency of the signal being transmitted has the advantageous effect of increasing the signal quality while also lowering cost. Furthermore, since the test substrate 31 does not need to transmit high-frequency signals, the insulating board 32 and the insulating board 34 can be formed using less expensive materials.

FIG. 7 is a cross-sectional view of a circuit module 30 according to a third embodiment, as seen from the side. In FIG. 7, the through-connector 56 includes a covering section 562 and a protruding section 564. The covering section 562 seals the through-hole formed in the side of the sealing section 38. The protruding section 564 protrudes into a region sealed by the sealing section 38, and the test circuit 36 is inserted therein.

The protruding section 564 includes two plates that sandwich the test circuit 36. At least one of the two plates includes a connection terminal on the surface thereof that contacts the test circuit 36, to be electrically connected to the test circuit 36. As a result, the circuit module 30 can transmit signals output by the test circuit 36 to an external circuit without cable loss.

A fixed section 74 is fixed to the surface of the test substrate 31 in a region sealed by the sealing section 38. The test circuit 36 is inserted into the protruding section 564 and mounted on the fixed section 74. The test circuit 36 may be mounted on the fixed section 74 via the converting section 72. If the test circuit 36 is a multi-chip module, the intervals between terminals formed on the test circuit 36 are small. When a test circuit 36 with small intervals between terminals is mounted on a test substrate 31 with a large surface area, thermal contraction can cause connection problems between the test circuit 36 and the test substrate 31. Therefore, the converting section 72 may be an interposer that changes the pitch of the terminals interposed between the test circuit 36 and the fixed section 74.

Figure 8:
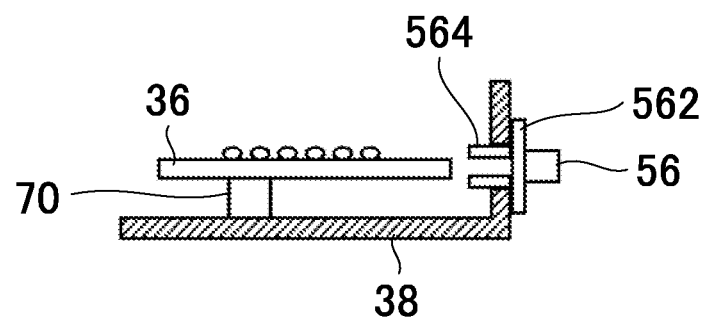
FIG. 8 shows a first step in a process for manufacturing the test module 30.
Figure 10:
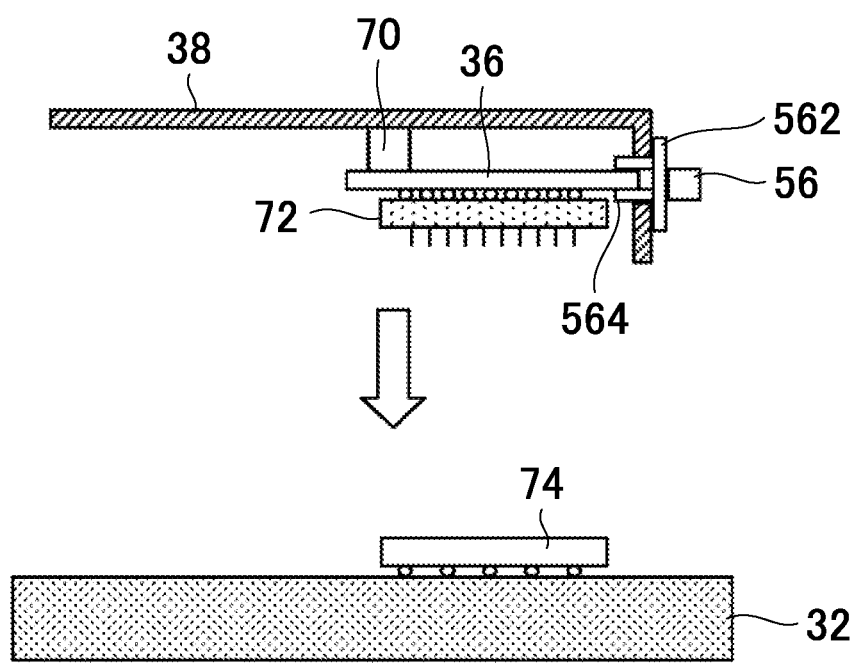
FIG. 10 shows a third step in a process for manufacturing the test module 30.

When manufacturing the circuit module 30, first, the test circuit 36 is inserted into the protruding section 564. Next, the sealing section 38 is fixed to the test substrate 31 and the test circuit 36 is mounted on the fixed section 74. Finally, the inside of the sealing section 38 may be filled with the cooling agent. FIGS. 8 to 10 show a process of manufacturing the circuit module 30 shown in FIG. 7

FIG. 8 shows a state prior to the test circuit 36 being inserted into the through-connector 56. The test circuit 36 is mounted on the protrusion 70, which is connected to the sealing section 38. The protrusion 70 may be formed integrally with the sealing section 38. FIG. 9 shows a state in which the test circuit 36 is inserted in the through-connector 56. With the protrusion 70 providing support, the test circuit 36 is moved toward the protruding section 564 and inserted therein.

FIG. 10 shows a method for connecting the test circuit 36 to the insulating board 32. The converting section 72 is fixed to the test circuit 36 and the fixed section 74 is fixed to the insulating board 32. The converting section 72 and the fixed section 74 may each be connected by having pressure applied thereto, and may be detached after being connected. Prior to the test circuit 36 being inserted into the protruding section 564, the converting section 72 may be connected to the test circuit 36 by soldering, for example. As a result of the process described above, the test circuit 36 can be directly connected to the through-connector 56 without using a cable.

Figure 11:
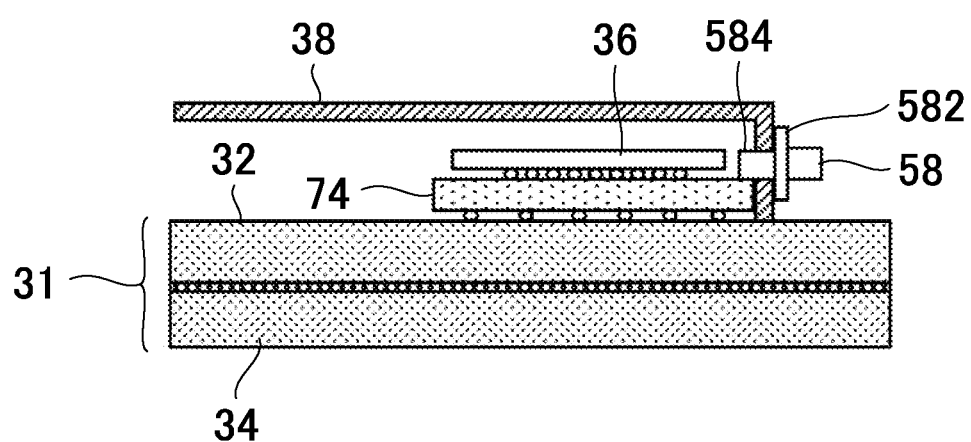
FIG. 11 is a cross-sectional view of a circuit module 30 according to a fourth embodiment, as seen from the side.

FIG. 11 is a cross-sectional view of a circuit module 30 according to a fourth embodiment, as seen from above. In FIG. 11, the fixed section 74 is fixed to the surface of the test substrate 31 in a region sealed by the sealing section 38. The test circuit 36 is mounted on the fixed section 74. The sealing section 38 has a side surface that is substantially perpendicular to the test substrate 31, and the through-connector 56 is provided on the side surface of the sealing section 38.

The fixed section 74 contacts the side surface of the sealing section on which the through-connector 58 is provided, and is connected to the through-connector 58. The through-connector 58 includes the covering section 582 and the protruding section 584. The protruding section 584 includes a metal terminal on the bottom surface thereof, and is connected to the fixed section 74. The fixed section 74 may transmit the signals output by a portion of the terminals of the test circuit 36 to the test substrate 31, and transmit signals output from another portion of the terminals of the test circuit 36 to the through-connector 58. Furthermore, the frequency of the signals transmitted to the through-connector 58 by the fixed section 74 may be higher than the frequency of the signals transmitted by the fixed section 74 to the test substrate 31.

Figure 12:
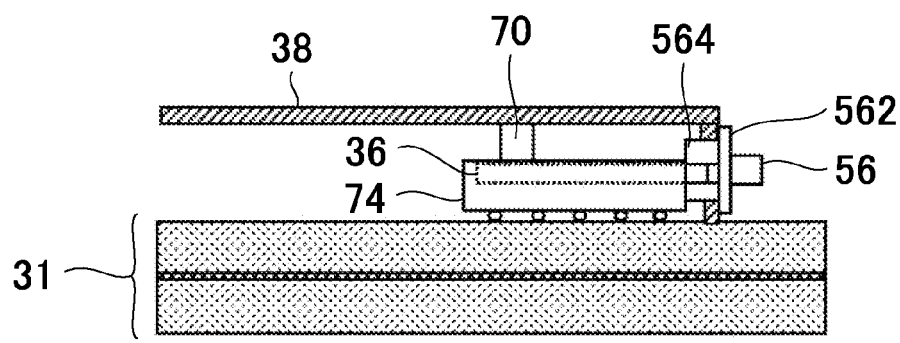
FIG. 12 is a cross-sectional view of a circuit module 30 according to a fifth embodiment, as seen from the side.

FIG. 12 is a cross-sectional view of a circuit module 30 according to a fifth embodiment, as seen from the side. FIG. 13 is a perspective view of the fixed section 74 and the test circuit 36 according to the fifth embodiment. The fixed section 74 may be formed such that, from among the edges of the surface on which the test circuit 36 is mounted, edges thereof other than the edge facing the side surface of the sealing section 38 on which the protruding section 564 is provided may protrude from the surface on which the test circuit 36 is mounted.

For example, as shown in FIG. 13, a position on the top edge nearest the protruding section 564, from among the edges of the fixed section 74, and a position of the bottom surface of the test circuit 36 in the height direction may be substantially the same as the position of the board of the protruding section 564 in the height direction. The other three edges of the fixed section 74 protrude from the surface on which the test circuit 36 is mounted by a length substantially equal to the thickness of the test circuit 36.

Figure 14:
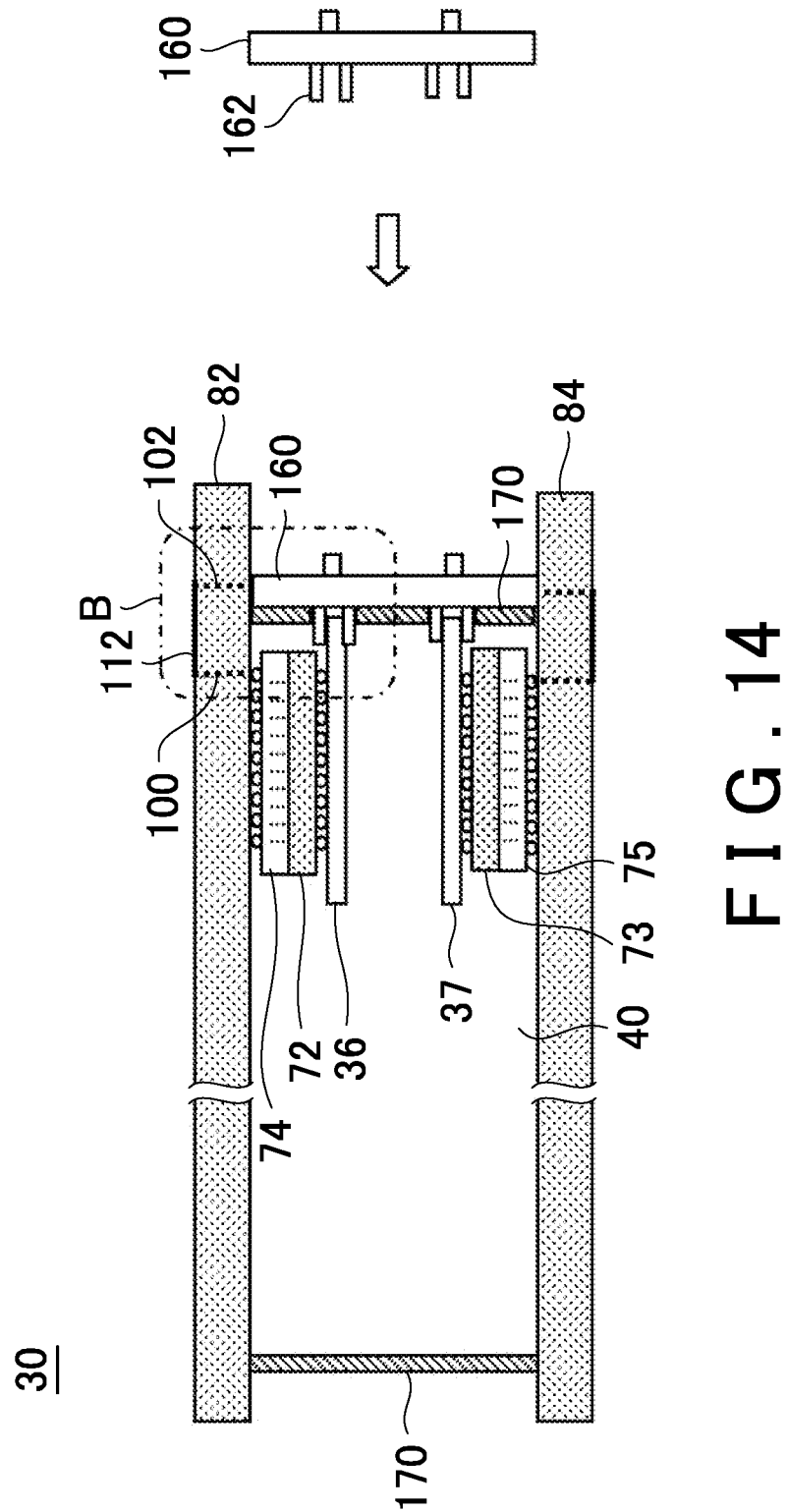
FIG. 14 is a cross-sectional view of a circuit module 30 according to a sixth embodiment, as seen from the side.

FIG. 14 is a cross-sectional view of a circuit module 30 according to a sixth embodiment, as seen from the side. In FIG. 14, the circuit module 30 includes a first test substrate 82 and a second test substrate 84 arranged facing each other. The first test substrate 82 includes the first test circuit 36 on the surface thereof facing the second test substrate 84. The second test substrate 84 includes the second test circuit 37 on the surface thereof facing the first test substrate 82. The through-connector 160 and the sealing section 170 are sandwiched between the first test substrate 82 and the second test substrate 84, and the through-connector 160 is connected to through-holes formed in the sealing section 170.

The sealing section 170 may be a cylinder having an opening therein. The first test substrate 82 and the second test substrate 84 sandwich the opening of the sealing section 170, thereby forming a sealed space between the first test substrate 82 and the second test substrate 84. The first test circuit 36 and the second test circuit 37 are enclosed in this common sealed space 40. By filling the sealed space 40 with the cooling agent, the first test circuit 36 and the second test circuit 37 are cooled.

The first test circuit 36 may be electrically connected to the first test substrate 82 via the converting section 72 and the fixed section 74. The second test circuit 37 may be electrically connected to the second test substrate 84 via the converting section 73 and the fixed section 75.

Figure 15:
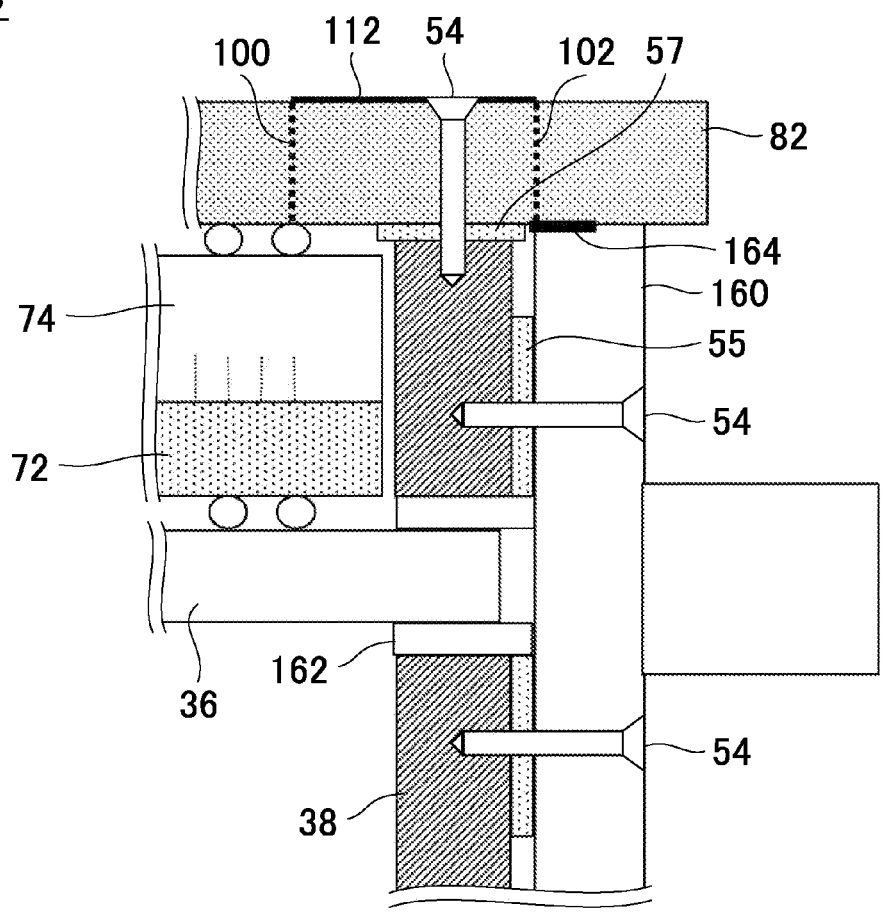
FIG. 15 shows an enlarged view of a region B near the sealing section 170 of the through-connector 160 according to the sixth embodiment.

FIG. 15 shows an enlarged view of a region B near the sealing section 170 of the through-connector 160 according to the sixth embodiment. In FIG. 15, the through-connector 160 may be fixed to the sealing section 38 by screws 54, while sandwiching packing 55. The sealing section 38 may be fixed to the first test substrate 82 by a screw 54 while sandwiching packing 57. The through-connector 160 includes a protruding section 162 formed by two boards, at least one of which has a terminal that is formed of metal on the surface thereof facing the other board. The first test circuit 36 is inserted into the protruding section 162 to contact the terminal formed on at least one of the boards, thereby being electrically connected to the through-connector 160.

The first test circuit 36 may be connected to the through-connector 160 via the first test substrate 82. The signal output from the terminal of the first test circuit 36 is output to the first penetrating through-hole 100 formed on the first test substrate 82, via the converting section 72 and the fixed section 74.

The first penetrating through-hole 100 is connected to back-surface substrate wiring 112 formed on the back surface of the first test substrate, and the back-surface substrate wiring 112 extends from a region corresponding to a position inside of the sealing section 38 to a region corresponding to a position outside the sealing section 38. The first test circuit 36 and the second test circuit 37 are each provided in a region corresponding to a position inside the sealing section 38, and the connector 60 and the connector 64 are each provided in a region corresponding to a position outside the sealing section 38.

The back-surface substrate wiring 112 is connected to the second penetrating through-hole 102, in a region corresponding to a position outside the sealing section 38. The second penetrating through-hole 102 is connected to the connection terminal 164 on the surface of the first test substrate 82. By connecting the connection terminal 164 to the through-connector 160, the first test circuit 36 is electrically connected to the through-connector 160 via the converting section 72, the fixed section 74, the first penetrating through-hole 100, the back-surface substrate wiring 112, the second penetrating through-hole 102, and the connection terminal 164.

With the above configuration, the first test circuit 36 is electrically connected to the through-connector 160 via the protruding section 162, and is also electrically connected to the through-connector 160 via the first test substrate 82. Among the signals output by the first test circuit 36, the signals output to the through-connector 160 via the protruding section 162 may have a frequency that is higher than the frequency of signals output to the through-connector 160 via the first test substrate 82.

Figure 16:
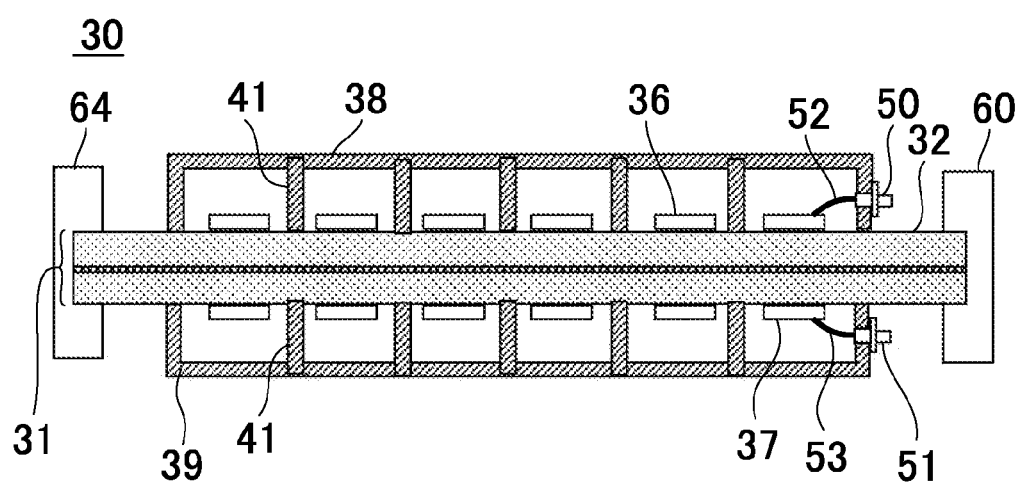
FIG. 16 is a cross-sectional view of the overall circuit module 30.
Figure 17:
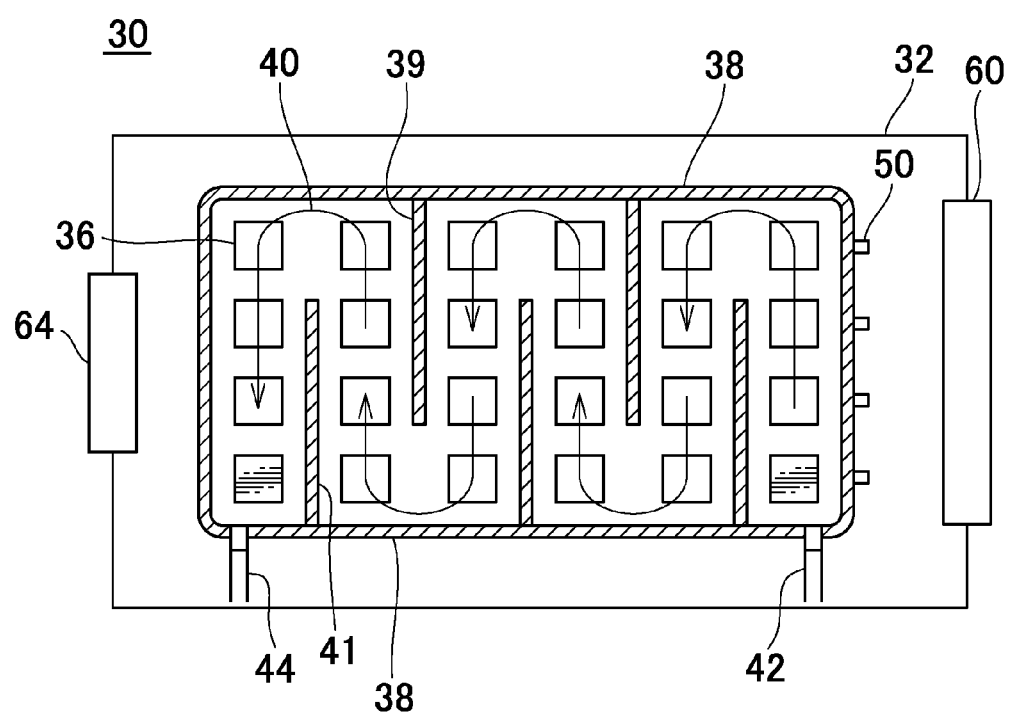
FIG. 17 is a cross-sectional view of the overall circuit module 30 as seen from above.

FIG. 16 is a cross-sectional view of the overall circuit module 30 shown in FIG. 2, as seen from the side. FIG. 17 is a cross-sectional view of the overall circuit module 30 as seen from above. The circuit module 30 includes barrier walls 41 that form paths for the cooling agent in the regions sealed by the sealing section 38 and the sealing section 39.

The sealing section 38 and the sealing section 39 each have side surfaces that are substantially perpendicular to the test substrate 31. The through-connector 50 and the through-connector 51 are provided on a side surface of the sealing section 38 in a region formed substantially parallel to the barrier walls 41. The first test circuit 36 and the second test circuit 37 are respectively connected to the through-connector 50 and the through-connector 51 by the cable 52 and the cable 53.

The barrier walls 41 may be provided extending from the first test substrate 82 to the second test substrate 84, and may form the flow paths by which the sealed space 40 is filled with the cooling agent. Each barrier wall 41 extends from one horizontal surface, i.e. a surface perpendicular to the connector 60, of the sealing section 38 toward the other surface until a position immediately before the other surface. Furthermore, odd-numbered barrier walls 41 and even-numbered barrier walls 41, as counted from a vertical surface, i.e. a surface parallel to the connector 60, of the sealing section 38 extend respectively from different horizontal surfaces of the sealing section 38.

The sealed space 40 is filled with the cooling agent and, as shown by the arrows in FIG. 17, the cooling agent flows from the cooling agent inlet 42 to the cooling agent outlet 44. As a result of the cooling agent flowing between the first test circuit 36 and the second test circuit 37 within the sealed space 40 formed by the sealing section 38 and the barrier walls 41, the first test circuit 36 and the second test circuit 37 are cooled. The barrier walls 41 may be arranged according to intervals between semiconductor devices arranged in a matrix.

As described above, by providing the through-connector 50 in a region on the side surface of the sealing section 38 formed substantially parallel to the barrier walls 41, the direction in which the cooling agent flows becomes substantially perpendicular to the direction in which the cable 52 connects the first test circuit 36 and the through-connector 50. As a result, it becomes more difficult for the through-connector 50 to be affected by the pressure of the cooling agent.

The cooling agent can be made to flow by attaching a cooling agent circulation apparatus to the cooling agent inlet 42 and the cooling agent outlet 44. The cooling agent circulation apparatus can cause the cooling agent to be injected from the cooling agent inlet 42 and ejected from the cooling agent outlet 44, and the configuration of the cooling agent circulation apparatus is not particularly limited. Furthermore, the circuit modules 30 according to embodiments other than the embodiment shown in FIG. 2 may use the configuration shown in FIGS. 16 and 17.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a test circuit that is provided on a test substrate and tests the device under test;
    a sealing section that covers a region of the test substrate on which the test circuit is formed, and seals the test circuit to form a sealed space that is filled with a cooling agent;
    a through-connector that passes through the sealing section and electrically connects the test circuit to an element provided outside the sealing section, such that the connection is not through the test substrate, wherein
    the through-connector includes a protruding section that protrudes into a region sealed by the sealing section and has the test circuit inserted therein, and
    the test apparatus further comprises a fixed section that is fixed to a surface of the test substrate in the region sealed by the sealing section and that has the test circuit, which is inserted in the protruding section, mounted thereon.

2. The test apparatus according to claim 1, wherein
    the test circuit is a first test circuit provided on an opposite side of the test substrate from a second test circuit,
    the sealing section is a first sealing section provided on an opposite side of the test substrate from a second sealing section,
    the through-connector is a first through-connector provided on an opposite side of the test substrate from a second through-connector,
    the second test circuit test the device under test,
    the second sealing section covers a region of the test substrate on which the second test circuit is formed, and seals the second test circuit to form a sealed space that is filled with a cooling agent,
    the second through-connector passes through the second sealing section and electrically connects the second test circuit to an element provided outside the sealing section, such that the connection is not through the test substrate,
    the second through-connector includes a protruding section that protrudes into a region sealed by the second sealing section and has the second test circuit inserted therein, and
    the test apparatus further comprises the second test circuit, the second sealing section, and the second through-connector.

3. The test apparatus according to claim 1, further comprising substrate wiring that is formed on the test substrate and electrically connects the test circuit to an element provided outside the sealing section, wherein
    the through-connector transmits higher-frequency signals than the substrate wiring.

4. The test apparatus according to claim 1, further comprising a barrier wall that forms a flow path for the cooling agent, in a region sealed by the sealing section, wherein
    the sealing section has a side surface that is substantially perpendicular to the test substrate, and
    the through-connector is provided in the side surface of the sealing section in a region formed substantially parallel to the barrier wall.

5. The test apparatus according to claim 1, wherein
    the fixed section is formed such that, among edges of a surface thereof on which the test circuit is mounted, an edge that does not face the side surface of the sealing section on which the protruding section is provided protrudes from the surface on which the test circuit is mounted.

6. The test apparatus according to claim 1, wherein
    the sealing section includes a through-hole in which the through-connector is arranged, and
    the through-connector includes a covering section that is provided on an outer surface of the sealing section and seals the through-hole.

7. A test apparatus that tests a device under test, comprising:
    a first test substrate and a second test substrate arranged facing each other;
    a first test circuit that is provided on a surface of the first test substrate facing the second test substrate and tests the device under test;
    a second test circuit that is provided on a surface of the second test substrate facing the first test substrate and tests the device under test;
    a sealing section that seals the first test circuit and the second test circuit in a common space filled with a cooling agent by sealing a space between the first test substrate and the second test substrate; and
    a through-connector that passes through the sealing section and electrically connects the first and second test circuits to an element provided outside the sealing section, such that the connection is not through the test substrate.

8. The test apparatus according to claim 7, further comprising:
    a first fixed section that is fixed to a surface of the first test substrate in a region sealed by the sealing section and that has the first test circuit mounted thereon; and a second fixed section that is fixed to a surface of the second test substrate in a region sealed by the sealing section and that has the second test circuit mounted thereon, wherein the sealing section includes a side surface substantially perpendicular to the first and second test substrates, the through-connector is provided in the side surface of the sealing section, and the first and second fixed sections are arranged to contact the side surface of the sealing section on which the through-connector is formed, and the first fixed section is connected to the through-connector.

* * * * *